(12) United States Patent
Mihnea et al.

(10) Patent No.: US 6,493,280 B2
(45) Date of Patent: Dec. 10, 2002

(54) METHOD OF REDUCING TRAPPED HOLES INDUCED BY ERASE OPERATIONS IN THE TUNNEL OXIDE OF FLASH MEMORY CELLS

(75) Inventors: Andrei Mihnea, San Jose, CA (US); Jeffrey Kessenich, Boise, ID (US); Chun Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/982,682

(22) Filed: Oct. 22, 2001

(65) Prior Publication Data

US 2002/0121653 A1 Sep. 5, 2002

Related U.S. Application Data

(62) Division of application No. 09/797,682, filed on Mar. 5, 2001.

(51) Int. Cl.[7] .................................................. G11C 7/00
(52) U.S. Cl. ............... 365/218; 365/185.29; 365/185.3; 365/185.28; 365/185.18; 365/185.22
(58) Field of Search ........................... 365/218, 185.01, 365/185.29, 185.28, 185.3, 185.18, 185.22

(56) References Cited

U.S. PATENT DOCUMENTS

| 5,837,585 | A | | 11/1998 | Wu et al. | |
|---|---|---|---|---|---|
| 5,978,274 | A | | 11/1999 | Wang | |
| 6,026,026 | A | | 2/2000 | Chan et al. | |
| 6,049,479 | A | | 4/2000 | Thurgate et al. | |
| 6,055,190 | A | * | 4/2000 | Lu et al. | 365/185.22 |
| 6,122,198 | A | * | 9/2000 | Haddad et al. | 365/185.22 |
| 6,198,664 | B1 | * | 3/2001 | Fastow | 365/185.29 |
| 6,252,803 | B1 | * | 6/2001 | Fastow et al. | 365/185.22 |
| 6,285,588 | B1 | * | 9/2001 | Fastow | 365/185.19 |
| 6,285,599 | B1 | * | 9/2001 | Shimada et al. | 365/185.29 |
| 6,356,974 | B2 | * | 3/2002 | Chevallier | |
| 6,381,670 | B1 | * | 4/2002 | Lee et al. | 711/103 |
| 6,407,948 | B1 | * | 6/2002 | Chou | 365/185.3 |

OTHER PUBLICATIONS

Chun Chen et al., "Tunneling Induced Charge Generation in $SiO_2$ Thin Films," Journal of Applied Physics, vol. 83, No. 7, Apr. 1998, pp. 3898 to 3905.

Gautam Verma et al., "Reliability Performance of ETOX Based Flash Memories," IEEE/IRPS 1988, pp. 158–166.

* cited by examiner

Primary Examiner—Viet Q. Nguyen
(74) Attorney, Agent, or Firm—Dickstein Shapiro Morin & Oshinsky LLP

(57) ABSTRACT

A method of erasing memory cells in a flash memory device that recombines holes trapped in the tunnel oxide (after an erase operation) with electrons passing through the tunnel oxide is disclosed. The method uses an erase operation that over-erases all memory cells undergoing the erase operation. A cell healing operation is performed on the over-erased cells. The healing operation causes electrons to pass through the tunnel oxide and recombine with trapped holes. The recombination substantially reduces the trapped holes within the tunnel oxide without reducing the speed of the erase operation. Moreover, by reducing trapped holes, charge retention, overall performance and endurance of the flash memory cells are substantially increased.

29 Claims, 7 Drawing Sheets

METHOD OF REDUCING TRAPPED HOLES INDUCED BY ERASE OPERATIONS IN THE TUNNEL OXIDE OF FLASH MEMORY CELLS

This application is a divisional of application Ser. No. 09/797,682, filed on Mar. 5, 2001, which is hereby incorporated by reference in its entirety.

FIELD OF THE INVENTION

The present invention relates to the field of semiconductor memory devices and, more particularly to a method of reducing trapped holes in a tunnel oxide layer of flash memory cells.

BACKGROUND OF THE INVENTION

A nonvolatile memory is a type of memory that retains stored data when power is removed. There are various types of nonvolatile memories including e.g., read only memories (ROMs), erasable programmable read only memories (EPROMs), and electrically erasable programmable read only memories (EEPROMs). One type of EEPROM device is the flash EEPROM device (also referred to as "flash memory").

Each nonvolatile memory device has its own unique characteristics. For example, the memory cells of an EPROM device are erased using an ultraviolet light, while the memory cells of an EEPROM device are erased using an electrical signal. In a conventional flash memory device blocks of memory cells are simultaneously erased (what has been described in the art as a "flash-erasure"). The memory cells in a ROM device, on the other hand, cannot be erased at all. EPROMs, EEPROMs and flash memory are commonly used in computer systems that require reprogrammable nonvolatile memory.

A conventional flash memory device includes a plurality of memory cells, each cell is provided with a floating gate covered with an insulating layer. There is also a control gate which overlays the insulating layer. Below the floating gate is another insulating layer sandwiched between the floating gate and the cell substrate. This insulating layer is an oxide layer and is often referred to as the tunnel oxide. The substrate contains doped source and drain regions, with a channel region disposed between the source and drain regions.

In a flash memory device, a charged floating gate represents one logic state, e.g., a logic value "0", while a non-charged floating gate represents the opposite logic state e.g., a logic value "1". The flash memory cell is programmed by placing the floating gate into one of these charged states. Charges may be injected or written on to the floating gate by any number of methods, including e.g., avalanche injection, channel injection; Fowler-Nordheim tunneling, and channel hot electron (CHE) injection. The floating gate may be discharged or erased by any number of methods including e.g., Fowler-Nordheim tunneling.

During a typical erase operation by Fowler-Nordheim tunneling, charges stored on the floating gate are driven out of the floating gate, through the tunnel oxide, and in to the source region. This tunneling of electrons may be achieved by applying a relatively low positive voltage (e.g., approximately 5 volts) to the source region and a relatively large negative voltage (e.g., −8 to −12 volts) to the control gate. The substrate is usually grounded and the drain region is usually left floating. These voltages create an electric field between the floating gate and the source region, which induces the electrons previously stored on the floating gate to tunnel through the tunnel oxide to the source region.

Unfortunately, the charge retention property of flash memory cells becomes degraded after a number of programming and erase cycles. This degradation is believed to be caused by the presence of holes that become trapped in the tunnel oxide after an erase operation. After each erase operation, more holes become trapped within the tunnel oxide. It is believed that these trapped holes induce a localized reduction of a potential barrier that is used to prevent electrons stored on the floating gate from escaping through the tunnel oxide. The sites in the tunnel oxide with the reduced barrier essentially create a path for the stored electrons to leak or escape from the floating gate (referred to herein as a "leakage path").

The leakage path leads to a gradual discharging of the floating gate during times when the floating gate is expected to retain its charge. Also, the reduced barrier for tunneling can induce faster, erratic erasure for the relevant cells in a subsequent erase operation, leading to excess column current and read and/or program failure. Both charge leakage and erratic erasure adversely impact the program/erase cycling performance, charge retention and overall endurance of the flash memory cell. The term "cycle" or "cycling" typically refers to the sequence of one program operation and one erase operation. Data retention is impacted because data cannot be stored at the desired potential. Endurance is impacted because after a number of cycles the flash memory cells will no longer be able to be programmed with a charge suitable for the logic levels associated with a logic "1" or "0". Thus, there is a desire and need for a method of erasing flash memory cells that substantially reduces trapped holes within the tunnel oxide of the flash memory device.

There have been attempts to reduce the number of trapped holes within the tunnel oxide of the flash memory cell. One technique is to reduce the number of holes injected into the tunnel oxide during the erase operation. This can be achieved by e.g., reducing the voltages used during the erase operation. These techniques, however, typically reduce the speed of the erase operation. Moreover, holes that are injected into the tunnel oxide may still become trapped, which eventually degrades the performance and endurance of the flash memory device. Thus, there is a desire and need for a method of erasing flash memory cells that substantially improves the overall performance and endurance of the flash memory device without adversely impacting the speed of the erase operation.

SUMMARY OF THE INVENTION

The present invention provides a method of erasing memory cells within a flash memory device that substantially reduces trapped holes within the tunnel oxide of the device.

The present invention also provides a method of erasing flash memory cells that substantially improves the overall performance and endurance of the flash memory device without adversely impacting the speed of the erase operation.

The above and other features and advantages are achieved by a method of erasing memory cells in a flash memory device that recombines holes trapped in the tunnel oxide (after an erase operation) with electrons passing through the tunnel oxide. The method uses an erase operation that over-erases each memory cell undergoing the erase operation. A cell healing operation is performed on all of the over-erased cells. The healing operation causes electrons to pass through the tunnel oxide and recombine with trapped holes. The recombination substantially reduces the trapped holes within the tunnel oxide without reducing the speed of the erase operation. Moreover, by reducing trapped holes, charge retention, overall performance and endurance of the flash memory cells are substantially increased.

BRIEF DESCRIPTION OF THE DRAWINGS

The above and other advantages and features of the invention will be more clearly understood from the following detailed description of the invention, which is provided in connection with the accompanying drawings in which.

DETAILED DESCRIPTION OF THE PREFERRED EMBODIMENTS

Figure 1:
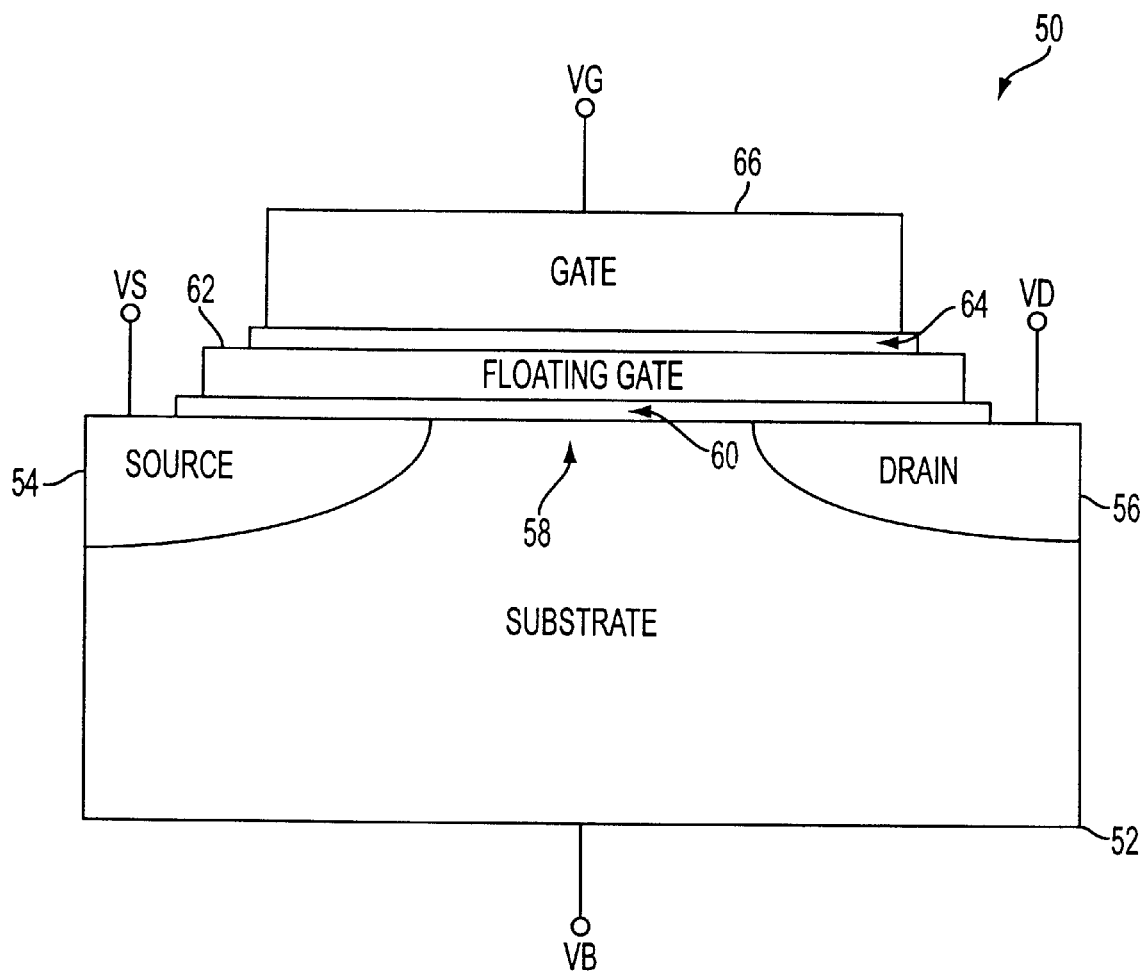
FIG. 1 is a diagram illustrating an exemplary flash memory cell used by the invention.

The present invention will be described as set forth in the preferred embodiments illustrated in FIGS. 1–7. Other embodiments may be utilized and structural or logical changes may be made without departing from the spirit or scope of the present invention. Like items are referred to by like reference numerals.

Hereinafter, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

FIG. 1 is a diagram illustrating an exemplary flash memory cell 50 to be erased by one of the exemplary methods of the invention. The cell 50 has a stack-gate configuration and comprises a substrate 52 that may be a single crystalline silicon (Si) or other Si material. The substrate 52 may be doped with a p-type dopant to form a p-type substrate 52. Alternatively, the substrate 52 may be doped with an n-type dopant to form a n-type substrate 52, if so desired. The cell 50 includes source and drain regions 54, 56 formed within the substrate 52. If the substrate 52 has been doped with a p-type dopant, then the source and drain regions 54, 56 are created by implanting the substrate 52 with an n-type dopant to form n+ regions 54, 56. If, on the other hand, the substrate 52 has been doped with an n-type dopant, then the source and drain regions 54, 56 are created by implanting the substrate 52 with an p-type dopant to form p+ regions 54, 56.

The source region 54 is spaced apart from the drain region 56 to form a channel region 58 on the substrate 52 between the source and drain regions 54, 56. A tunnel oxide layer 60 is located on the surface of the substrate 52. The tunnel oxide layer 60 comprises a dielectric material such as e.g., silicon dioxide ($SiO_2$) and covers the channel 58 as well as portions of the source and drain regions 54, 56.

A floating gate 62 is formed over the tunnel oxide 60. The floating gate 62 is a conductive material and may be e.g., a polysilicon material. An insulating layer 64 is positioned on top of the floating gate 62. The insulating layer 64 comprises a dielectric material such as e.g., $SiO_2$. A control gate 66 is formed over the insulating layer 64. The control gate 66 is a conductive layer and may be a polysilicon layer. As will be discussed below, a substrate voltage VB may be applied to the substrate 52, a source voltage VS may be applied to the source region 54, a drain voltage VD may be applied to the drain region 56 and a gate voltage VG may be applied to the control gate 66 to erase (and program) the cell 50 in accordance with the present invention.

Figure 2:
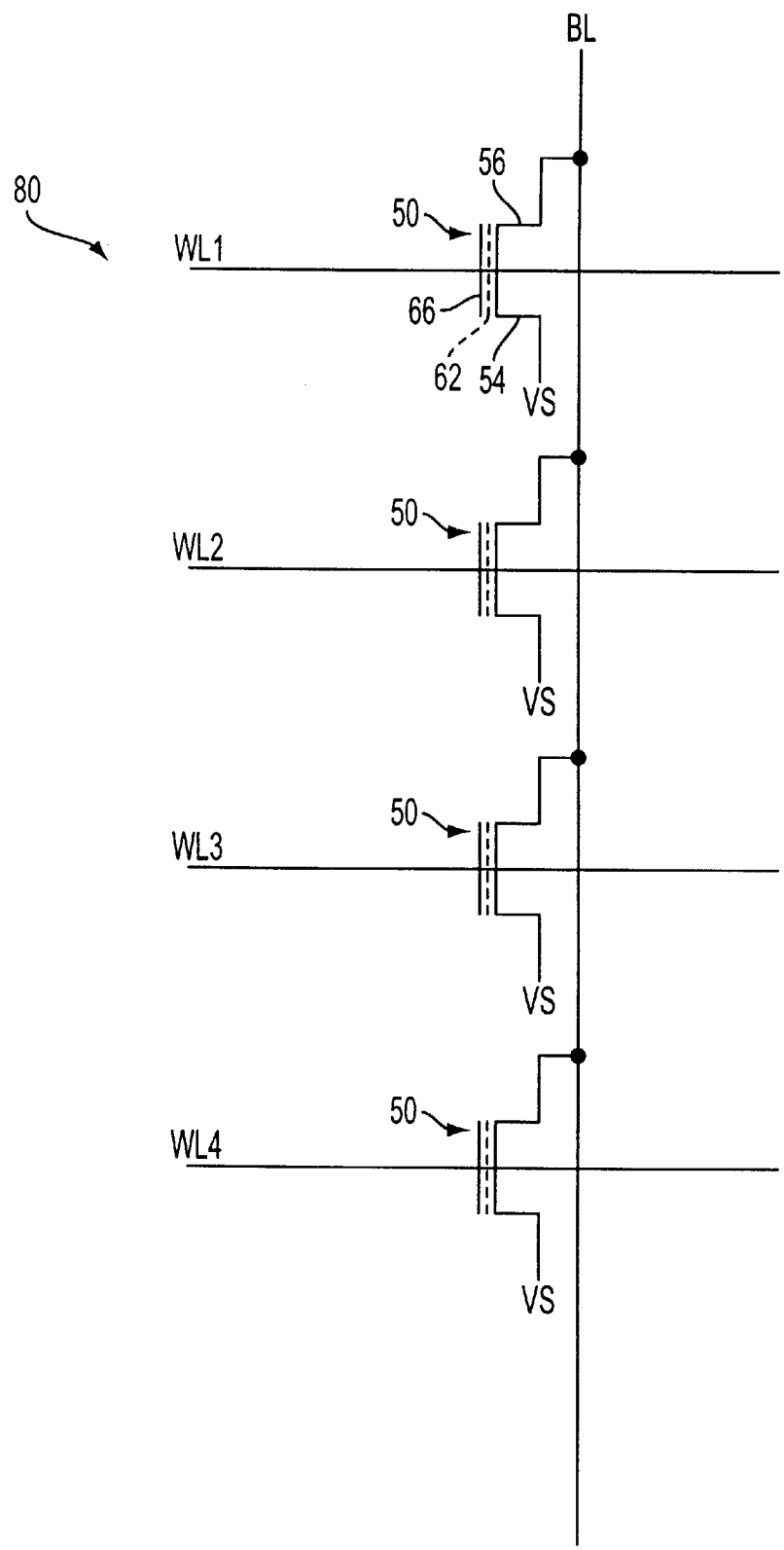
FIG. 2 is a diagram illustrating an exemplary column of memory cells in a flash memory device used by the invention.

FIG. 2 is a diagram illustrating an exemplary column 80 of memory cells 50 in a flash memory device operating in accordance with the invention. In the illustrated column 80, there are four flash memory cells 50. Each cell 50 has its drain region 56 connected to the same bit line BL. Each cell 50 has its control gate 66 connected to a respective word line WL1, WL2, WL3, WL4. Each cell 50 has its source region 54 connected to a source voltage VS. The configuration of the column 80 of memory cells 50 is what is known in the art as a NOR-type configuration. It should be noted that the column 80 can contain numerous cells 50, with each cell 50 connected to a respective word line, and that only four cells 50 are illustrated for clarity purposes. Moreover, it should be appreciated that a flash memory device would contain numerous columns 80 and that only one column 80 is illustrated for clarity purposes.

Figure 3:
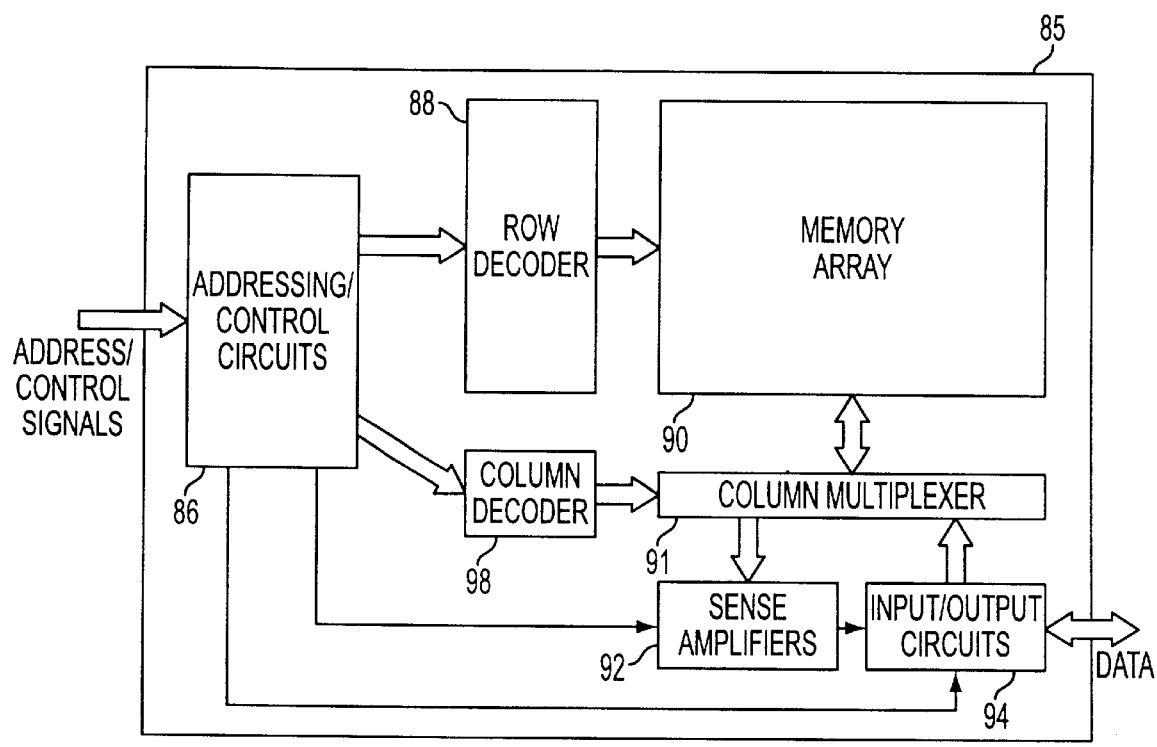
FIG. 3 is a diagram illustrating an exemplary flash memory device constructed in accordance with an embodiment of the invention.

FIG. 3 is a diagram illustrating an exemplary flash memory device 85 constructed in accordance with an embodiment of the invention. The device includes an array of flash memory cells 90 that are organized into rows and columns. The flash memory cells in the array 90 could be organized as illustrated in FIG. 2. As in most flash memory devices, the memory array 90 is subdivided into a plurality of sub arrays or blocks. As will be discussed below, all of the cells within a block are erased at the same time. The device 85 also includes an addressing and control circuit 86, a row decoder circuit 88, column decoder circuit 98, input/output (I/O) circuit 94 and a sense amplifier circuit 92.

The addressing/control circuit 86 receives address and control information from an external device such as a processor or other logic device. Data is input and output from the I/O circuit 94. As known in the art, the row decoder 88 inputs a row address from the addressing/control circuit 88, decodes the input address to obtain a word line address and uses the word line address to activate one of the word lines within the array 90. The array 90 is also connected to the I/O circuits 94 through the column multiplexer 91 and sense amplifiers 92. The column multiplexer 91 is controlled by the column decoder 98. The I/O circuit 94 includes conventional read circuitry (not shown) for outputting data from the array 90 to input/output pins of the device. The I/O circuit 94 also includes conventional write circuitry (not shown) for inputting data received on the input/output pins.

The column decoder circuit 98 receives a column address from the addressing/control circuit 86, decodes the column address and activates the appropriate column (i.e., bit line) of the array 90 (through the I/O circuit 94 and the sense amplifier circuit 92).

For the most part, the flash memory device 85 operates as a conventional flash memory device. That is, the device 85 may be controlled to read and write data into the memory array 90. Any suitable method for reading from, and writing information to, the array 90 may be used. However, the flash memory device 85 of the present invention utilizes unique methods for erasing the cells in the array 90. The methods of the invention substantially reduce the number of holes (typically attributable to the erase operation) trapped in the tunnel oxide 60 (FIG. 1) of the flash memory cells. By reducing the number of holes trapped in the tunnel oxide, the present invention substantially improves the performance, data retention and endurance of the cells without adversely impacting the speed of the erase operation.

Figure 4:
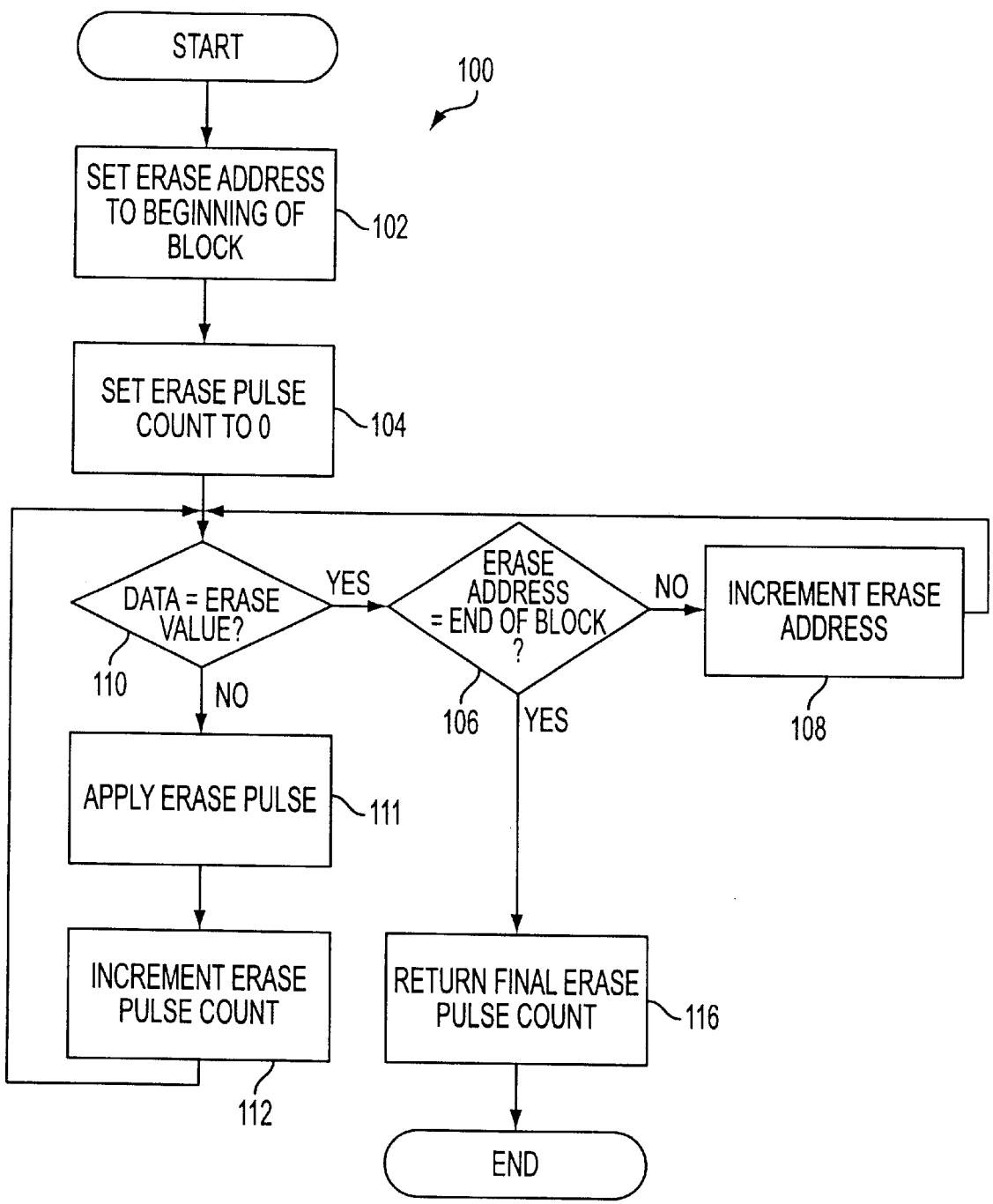
FIG. 4 is a flowchart illustrating a conventional method of erasing memory cells in a flash memory device.

Prior to discussing the methods of the invention, the conventional erase operation is now discussed. FIG. 4 is a flowchart illustrating a conventional method 100 of erasing memory cells in a flash memory device (e.g., the device 85 illustrated in 85 FIG. 3). The method 100 may be executed by the addressing/control circuit 86 (FIG. 3) or by any other control circuit used to control the erasing of flash memory cells. The method 100 performs an erase and verify operation on all of the flash memory cells in a particular block of memory cells.

Flash memory devices are typically subdivided into a plurality of sub arrays or blocks, each having their own starting and ending block addresses. The cells within a block are erased during the same erase operation. That is, the cells having an address within the range of the starting and ending block address will be erased. To do so, the method 100 begins by setting the erase address to the beginning of the block (i.e., the starting block address) (step 102). An erase pulse count is set to zero during step 104 and the method 100 is now ready to erase the cells within the block of memory.

At step 110 it is determined whether the data in the addressed cells are set to the erase value (e.g., the logic value "1"). This is commonly known as a verify operation. If at step 110 it is determined that the data is not set to the erase value, the method 100 continues at step 111. At step 111 an erase pulse is applied to the block, at step 112 the erase pulse count is incremented by one, and the method 100 returns to step 110 (erase verify). In this way, the method 100 executes the steps 110 (erase verify), 111 (erase pulse) and 112 (erase pulse count increment) in successive loops until the data at the selected erase address becomes set to the erase value. When at step 110 it is determined that the data is set to the erase value, then there is no need to further erase the addressed cells and the method 100 continues at step 106.

At step 106 it is determined whether the erase address is equal to the end of the block address (i.e., ending block address). If the erase address is not equal to the ending block address, the erase address is incremented by one (step 108) and the method 100 executes steps 110 (erase verify), 111 (erase pulse) and 112 (erase pulse count increment) until the data at the new erase address becomes set to the erase value. In this way, the method 100 executes the erase verify operation 110 in sequence on all addresses of a flash memory block and applies erase pulses to the block (step 111) as needed until all data in the block becomes set to the erase value.

When at step 106 it is determined that the erase address has become equal to the ending block address, then there are no more cells to erase. The erase operation is complete and the method 100 returns the erase pulse count (step 116) to the device executing the method 100. The erase pulse count can be used to report a successful erase operation. As will be described below with reference to FIG. 5, the erase count will be used by one of the methods 200 of the invention to conduct an over-erase operation on the flash memory cells.

Typically, flash memory is erased by setting the cells to the logic value "1." Thus, the erase value used in the method 100 could be a "1." It should be apparent, however, that the actual value used as the erase value does not matter and that any suitable value could be used for the erase value. All that is required is that the method 100 associate one logic value to an erase value and that the memory cells be set to the erase value during the erase operation.

Now that the conventional erase and verify operation has been described, a description of exemplary embodiments of the invention is now provided. As noted above, the conventional erase operation leaves trapped holes in the tunnel oxide of the flash memory cells. Over a number of cycles, the number of such trapped holes increases, which adversely impacts performance, data retention and endurance of the cells. The following exemplary methods 200 (FIG. 5), 300 (FIG. 6) will substantially reduce trapped holes and improve the performance, data retention and endurance of the flash memory cells.

Figure 5:
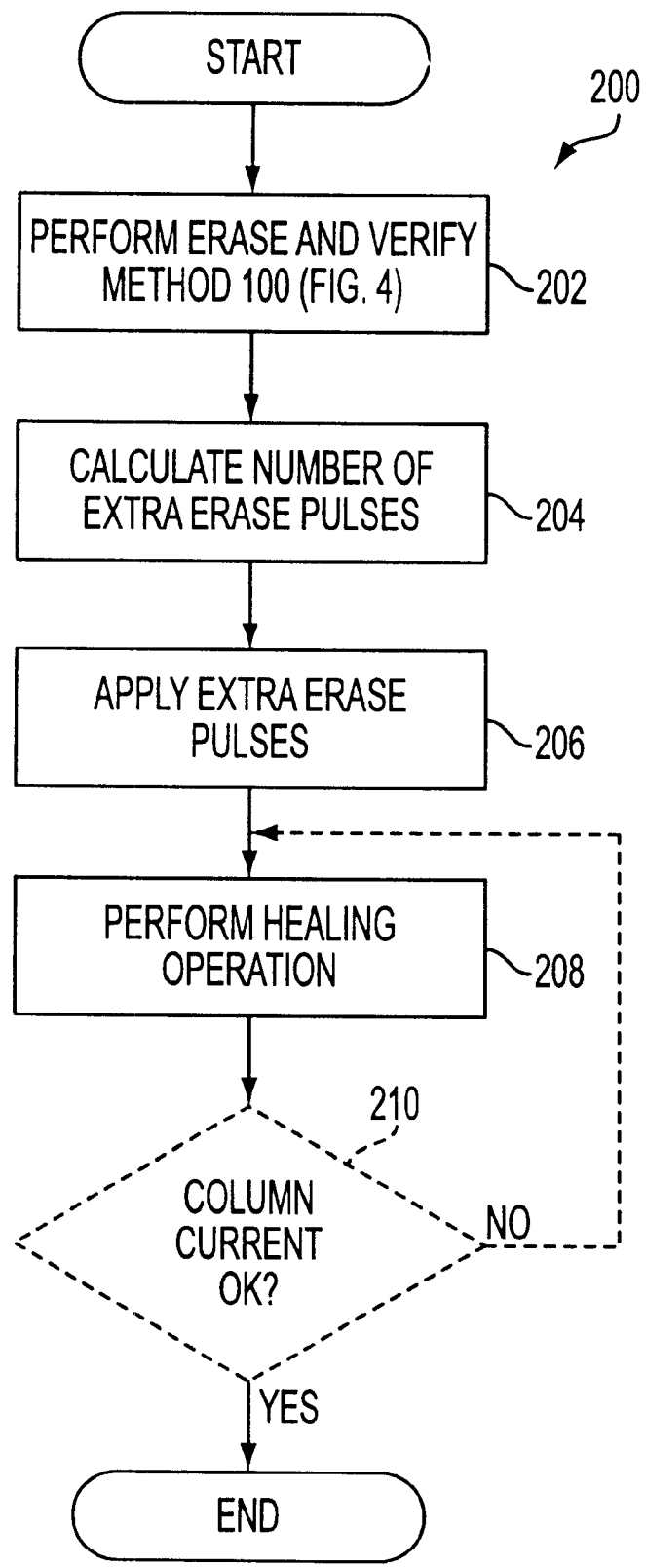
FIG. 5 is a flowchart illustrating an exemplary method of erasing memory cells in a flash memory device in accordance with a first exemplary embodiment of the invention.

FIG. 5 is a flowchart illustrating an exemplary method 200 of erasing memory cells in a flash memory device (e.g., the device 85 illustrated in FIG. 3) in accordance with a first exemplary embodiment of the invention. The method 200 may be executed by the addressing/control circuit 86 (FIG. 3) or by any other control circuit used to control the erasing of flash memory cells.

Referring to FIGS. 1 to 5, the method 200 begins at step 202 by executing the conventional erase and verify method 100. The erase operation used by the method 100 can be performed by setting the gate voltage VG within the range of −8 volts (V) to −12 V, the source voltage VS within the range of 2V to 7V, grounding the substrate voltage VB and floating the drain voltage VD. The application of these voltages VG, VS, VB, VD comprises the erase pulse. The duration of the erase pulse is approximately 10 milliseconds (ms). As noted above, the method 100 returns an erase pulse count signifying the number of erase pulses used to erase the block of memory cells (step 116).

At step 204, all of the flash memory cells 50 in a particular block have been erased and are in an "erased state." At step 204 a number of extra erase pulses is calculated. In one embodiment, the number of extra pulses is calculated based on the erase pulse count returned from the erase and verify method 100. The extra pulses are used to place all of the cells 50 into an "over-erased state." With the cells 50 in the over-erased state, holes trapped in the tunnel oxide 60 are in a state where they can be easily recombined with electrons present in the oxide. This recombination removes the holes from the tunnel oxide 60.

The over-erased state is a state where the flash memory cells 50 become conductive to a current value higher than an erase verify margin value. As known in the art, manufacturers set operating conditions (also known as specifications) for the memory cells 50 for the various operations that the cell 50 may undergo. The flash memory cell 50 will have a current margin for the conventional erase and verify operation (i.e., erase verify margin). This margin is used to define the current required by the cell 50 to have the erase value (e.g., a logic "1"). By staying within this margin, the cells 50 will be in the erased state. As will be described below, the method 200 places the cells 50 into the over-erased state by applying a number of extra erase pulses that will make the memory cells 50 conductive to a current value higher than the erase verify margin for the cell 50.

The calculation of the number of extra pulses ("NOE") can be e.g., based on the erase pulse count ("NE") returned from the method 100. One exemplary NOE can be calculated as follows:

$$NOE = A + B*NE, \quad (1)$$

where A is a constant real number selected from the range of 1 to 1000, and B is a constant real number selected from the range of 0 to 10. It should be noted that the number of extra pulses NOE can also be a predetermined fraction of the erase pulse count NE or a constant value that does not depend upon the erase pulse count NE, if so desired. The correct values can be determined from a calibration procedure or testing performed on the flash cells 50 to determine the best extra pulse ratio.

Once the number of extra erase pulses NOE has been calculated, extra erase pulses are applied to all cells 50 within the block of memory (step 206). These extra erase pulses have the same voltages VG, VS, VB, VD as described above. The application of the erase pulses places each cell 50 into the over-erased state. With the cells 50 in the over-erased state, holes trapped in the tunnel oxide 60 are in a state where they can be easily recombined with electrons present in the oxide 60. This recombination of holes and electrons removes the holes from the tunnel oxide 60, which achieves the desired benefits noted earlier. However, at the low rate of electron flux represented by the current discharging from the floating gate, the probability of recombination is rather low. Thus, a means for injecting electrons into the tunnel oxide 60 is now required.

At step 208 a healing step is performed on all of the over-erased memory cells 50. The healing step, which is essentially a programming operation, injects electrons into the tunnel oxide 60 of each cell 50 such that they pass through the tunnel oxide 60. Some of these electrons recombine with the trapped holes, and the others end up in the floating gate 62 thus taking the cell 50 out of the over-erased state. The healing step can be performed by Fowler-Nordheim electron injection by setting the source voltage VS and the substrate voltage VB to 0 V and the gate voltage VG within the range of 9 V to 13 V. The application of these voltages VG, VS, VB comprises a healing pulse. The healing pulse has a duration within the range of approximately 0.0001 seconds (secs) to 10 secs.

Alternatively, the healing operation can be performed by hot-electron injection from the source side of the channel 58, by biasing the memory cells 50 in a reverse channel conduction mode. This can be accomplished by setting the drain voltage VD within the range of 0 V to 3.5 V, the source voltage VS within the range of 3 V to 8 V (with VS>VD), and the gate voltage VG at a constant level within the range of 1 V to 6 V or ramped from an initial value in the range of −3 V to +1 V, to a final value in the range of 1 V to 6 V in a time of 0.00001 secs to 10 secs. Moreover, since hot-electron injection under these conditions occurs more or less across the entire length of the channel 58, forward channel conduction can also be used. This can be accomplished by setting the source voltage VS within the range of 0 V to 3.5 V, the drain voltage VD within the range of 3 V to 8 V (with VD>VS), and the gate voltage VG at a constant level within the range of 1 V to 6 V or ramped from an initial value in the range of −3 V to +1 V, to a final value in the range of 1 V to 6 V in a time of 0.00001 secs to 10 secs.

After the healing step has been performed (step 208), an optional step used to verify the current of the columns 80 may be performed (step 210). Since in the over-erased state the cell 50 may have a current higher than the maximum acceptable excess column current, the cell 50 must be placed into the margin for proper operation. Therefore, although not required, it may be desirable to verify that the cell 50 is within the margin for excess column current after step 208. If performed, step 210 determines whether the column current is within the acceptable margin. If it is determined that the column current is not within the margin, then the method 200 continues by performing another healing step on the cells 50 within the column 80 (step 208). Step 210 is illustrated with dashed lines in FIG. 5 to demonstrate that it is not required to practice the method 200 of the invention.

Thus, the method 200 performs an over-erase operation (step 206) on the memory cells 50 of the flash device 85 and a healing step (step 208) that substantially reduces the trapped holes within the tunnel oxide 60. The healing step (step 208) also ensures that the over-erased cells 50 are removed from the over-erased state so that the cells 50 will function in accordance with the manufacturers specifications for the flash memory device 85.

Figure 6:
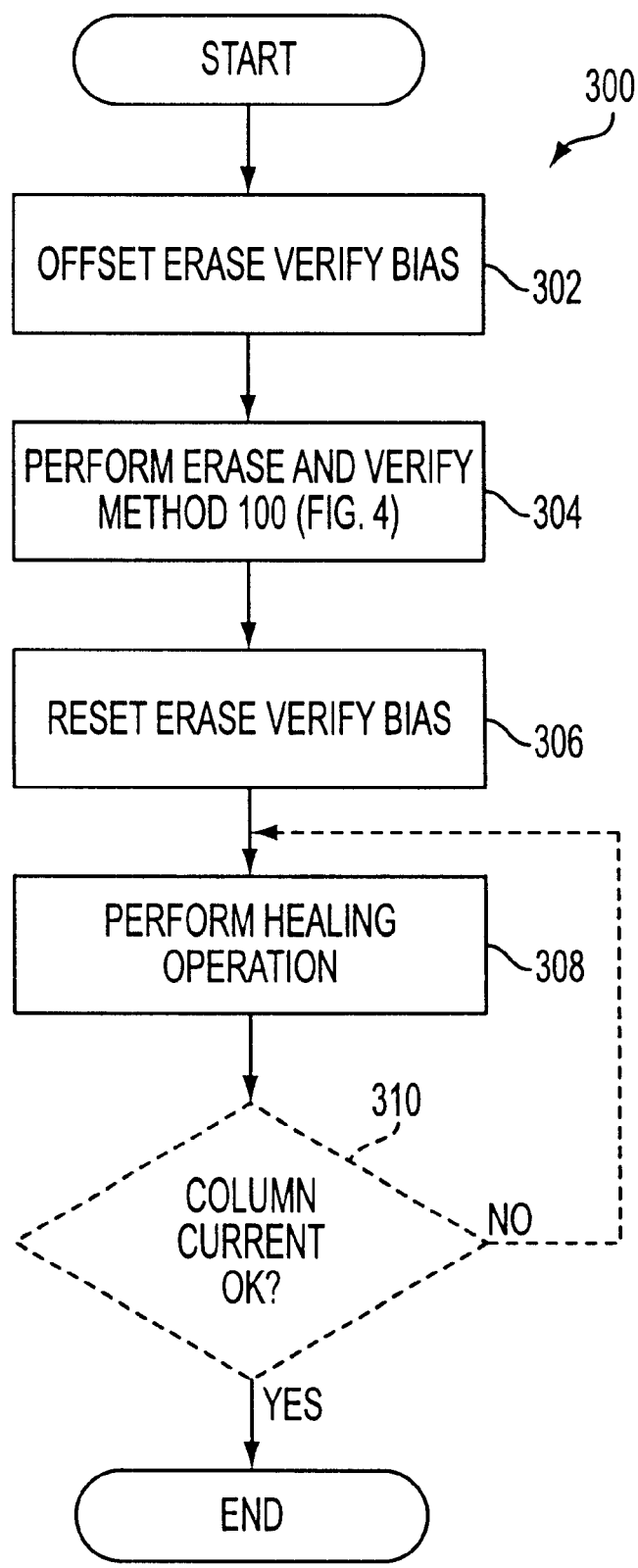
FIG. 6 is a flowchart illustrating another exemplary method of erasing memory cells in a flash memory device in accordance with a second exemplary embodiment of the invention.

FIG. 6 is a flowchart illustrating another exemplary method 300 of erasing memory cells in a flash memory device (e.g., the device 85 illustrated in FIG. 3) in accordance with a second exemplary embodiment of the invention. The method 300 may be executed by the addressing/control circuit 86 (FIG. 3) or by any other control circuit used to control the erasing of flash memory cells.

Referring to FIGS. 1–4 and 6, the method 300 begins at step 302 by offsetting an erase verify bias used during the conventional erase and verify method 100. An erase verify bias is used by the erase and verify method 100 to determine if the flash memory cell 50 has been erased (i.e., is set to the erase value). By offsetting the erase verify bias, the method 100 would require a more deeply erased or conductive condition in the flash memory cell 50 before declaring the cell 50 properly erased. The offset can be achieved by increasing the reference current used to differentiate between nonconductive (e.g., logic level "0") and conductive (e.g., logic level "1") states of the cell 50. For example, the reference current could be increased by a value in the range of 5 micro-amps ($\mu$A) to 30 $\mu$A. The offset can also be achieved by changing the gate bias applied to the memory cell 50 during the verify step (step 110). For example, the gate bias could be changed by a value in the range of 0.1 V to 2 V. In addition, both of these offset methods could be used.

The method 300 continues at step 304 by executing the conventional erase and verify method 100. By offsetting the erase verify bias in step 302, the erase and verify method 100 will place the cells 50 being erased into the over-erased state. That is, because a more deeply conductive state is required to verify the erased state, the method 100 will perform steps 110, 111 and 112 until the cells are over-erased. Although the method 100 can return the erase pulse count, it is not necessary to practice the method 300 of the current embodiment because the cells 50 are already over-erased when step 304 completes.

At step 306, the erase verify bias is reset to its original value to ensure proper performance of the device 85 for subsequent operations. At this point, the flash memory cells 50 in a particular block have been erased and are in the over-erased state. With the cells 50 in the over-erased state, holes trapped in the tunnel oxide 60 are in a state where they can be easily recombined with electrons present in the oxide.

This recombination removes the holes from the tunnel oxide 60. However, as noted earlier, a means for injecting electrons into the tunnel oxide 60 is required so that recombination can occur.

At step 308 a healing step is performed on the over-erased memory cells 50. The healing step, which is essentially a programming operation, injects electrons into the tunnel oxide 60 of each cell 50 such that they pass through the tunnel oxide 60, recombine with trapped holes or end up in the floating gate 62. The healing step can be performed by Fowler-Nordheim electron injection by setting the source voltage VS and the substrate voltage VB to 0 V and the gate voltage VG within the range of 9 V to 13 V. The application of these voltages VG, VS, VB comprises a healing pulse. The healing pulse has a duration within the range of approximately 0.0001 seconds (secs) to 10 secs.

Alternatively, the healing operation can be performed by hot-electron injection from the source side of the channel 58, by biasing the memory cells 50 in a reverse channel conduction mode. This can be accomplished by setting the drain voltage VD within the range of 0 V to 3.5 V, the source voltage VS within the range of 3 V to 8 V (with VS>VD), and the gate voltage VG at a constant level within the range of 1 V to 6 V or ramped from an initial value in the range of −3 V to +1 V, to a final value in the range of 1 V to 6 V in a time of 0.00001 secs to 10 secs. Moreover, since hot-electron injection under these conditions occurs more or less across the entire length of the channel 58, forward channel conduction can also be used. This can be accomplished by setting the source voltage VS within the range of 0 V to 3.5 V, the drain voltage VD within the range of 3 V to 8 V (with VD>VS), and the gate voltage VG at a constant level within the range of 1 V to 6 V or ramped from an initial value in the range of −3 V to +1 V, to a final value in the range of 1 V to 6 V in a time of 0.00001 secs to 10 secs.

After the healing step has been performed, an optional step 310 used to verify the current of the columns 80 may be performed. Since the cells 50 in the over-erased state may have a current higher than the maximum value for acceptable excess current, the cells 50 must be placed into the margin for proper operation. Therefore, although it is not required, it may be desirable to verify that the cells 50 are within the margin for excess column current. If performed, step 310 determines whether the column current is within the acceptable margin. If it is determined that the column current is not within the margin, then the method 300 continues by performing another healing step on the cells 50 within the column 80 (step 308). Step 310 is illustrated with dashed lines in FIG. 6 to demonstrate that it is not required to practice the method 300 of the invention.

Thus, the method 300 performs an over-erase operation (steps 302 and 304) on the memory cells 50 of the flash device 85 and a healing step (step 308) that substantially reduces the trapped holes within the tunnel oxide 60. The healing step (step 308) also ensures that the over-erased cells 50 are placed into an erased state so that the cells 50 will function in accordance with the manufacturers specifications for subsequent operations of the flash memory device 85.

Figure 7:
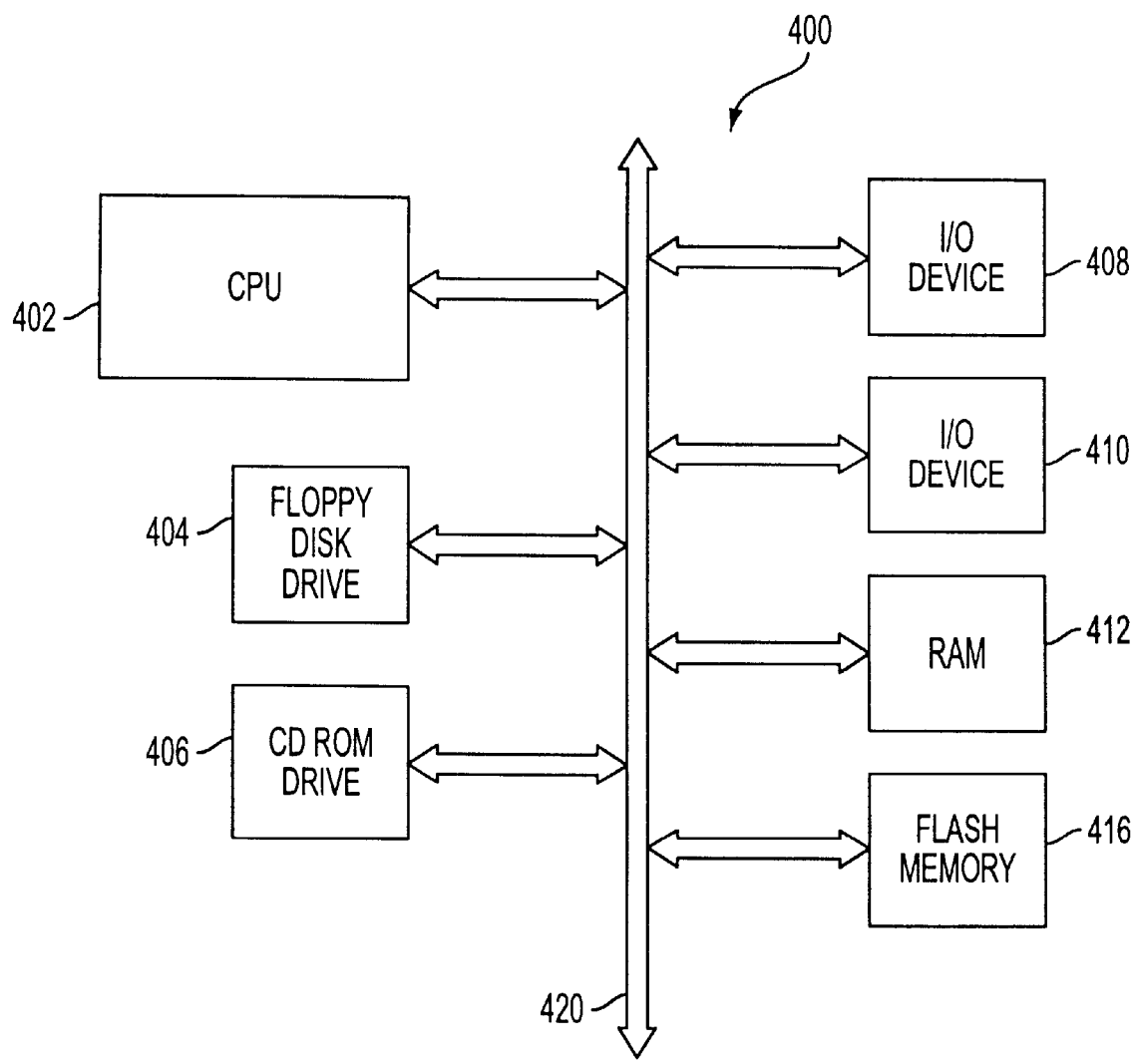
FIG. 7 is a block diagram illustrating a computer system utilizing the methods of erasing memory cells illustrated in FIGS. 5 and 6.

FIG. 7 is a block diagram of a processor-based system 400 utilizing a flash memory device 416 constructed in accordance with the present invention. That is, the flash memory device 416 is erased by one of the methods 200, 300 illustrated in FIGS. 5 and 6. The processor-based system 400 may be a computer system, a process control system or any other system employing a processor and associated memory. The system 400 includes a central processing unit (CPU) 402, e.g., a microprocessor, that communicates with the flash memory 416 and an I/O device 408 over a bus 420. It must be noted t hat the bus 420 may be a series of buses and bridges commonly used in a processor-based system, but for convenience purposes only, the bus 420 has been illustrated as a single bus. A second I/O device 410 is illustrated, but is not necessary to practice the invention. The processor-based system 400 also includes random access memory (RAM) device 412 and may include a read-only memory (ROM) device (not shown), and peripheral devices such as a floppy disk drive 404 and a compact disk (CD) ROM drive 406 that also communicates with the CPU 402 over the bus 420 as is well known in the art.

It should be noted that the methods 200, 300 of the invention are applicable to virtually all types of flash memory devices. Thus, the invention is not to be limited to the exemplary flash memory devices illustrated in FIGS. 1–3 and 7.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A flash memory device comprising:
   a plurality of flash memory cells; and
   a control circuit coupled to said memory cells, said control circuit for erasing a block of said memory cells until said cells are placed into an over-erased state and for injecting electrons into said over-erased memory cells.

2. The device of claim 1, wherein said control circuit erases said cells by applying at least one first erase pulse to each cell until all of said cells are in an erased state and by applying at least one additional erase pulse to each cell.

3. The device of claim 2, wherein said control circuit applies said at least one additional erase pulse by determining a number of additional erase pulses to apply based on a number of first erase pulses applied and by applying said determined number of additional erase pulses to each cell.

4. The device of claim 2, wherein said control circuit applies said at least one additional erase pulse by determining a number of additional erase pulses to apply and by applying said determined number of additional erase pulses to each cell.

5. The device of claim 1, wherein said control circuit erases said cells by offsetting an erase verify bias used to determine if said flash memory cells are in an erased state, applying at least one erase pulse to each flash memory cell, determining whether contents of said cells are erased using said offset erase verify bias.

6. The device of claim 5, wherein said control circuit offsets said erase verify bias by increasing a reference current used to differentiate between the erased state and a non-erased state.

7. The device of claim 5, wherein said control circuit offsets said erase verify bias by changing a gate bias applied to said cells.

8. The device of claim 5, wherein said control circuit offsets said erase verify bias by increasing a reference current used to differentiate between the erased state and a non-erased state and changing a gate bias applied to said cells.

9. The device of claim 1, wherein said control circuit injects electrons into said cells by Fowler-Nordheim electron injection.

10. The device of claim 1, wherein each cell is connected to receive a plurality of voltages and said control circuit injects electrons into said cells by Fowler-Nordheim electron injection caused by altering said voltages.

11. The device of claim 10, wherein said voltages comprise a gate voltage, drain voltage, source voltage and a substrate voltage.

12. The device of claim 1, wherein said control circuit injects electrons into said cells by hot-electron injection.

13. The device of claim 1, wherein each cell is connected to receive a plurality of voltages and said control circuit injects electrons into said cells by hot-electron injection by altering said voltages.

14. The device of claim 1, wherein said over-erased state is a state where said cells are more conductive than an erased state.

15. A flash memory device comprising:
a plurality of flash memory cells; and
a control circuit coupled to said memory cells, said control circuit for applying at least one first erase pulse to each flash memory cell until all of said cells are in an erased state, applying at least one additional erase pulse to each flash memory cell to place said cells into an over-erased state and for performing a healing operation on said over-erased memory cells.

16. A flash memory device comprising:
a plurality of flash memory cells; and
a control circuit coupled to said memory cells, said control circuit for offsetting an erase verify bias used to determine if said flash memory cells are in an erased state, applying at least one erase pulse to each flash memory cell, determining whether contents of said cells are erased using the offset erase verify bias and for performing a healing operation on said over-erased memory cells.

17. A system comprising:
a processor;
a flash memory device coupled to said processor, said flash memory device comprising:
a plurality of flash memory cells; and
a control circuit coupled to said memory cells, said control circuit for erasing a block of said memory cells until said cells are placed into an over-erased state and for performing a healing operation on said over-erased memory cells.

18. The system of claim 17, wherein said control circuit erases said cells by applying at least one first erase pulse to each cell until all of said cells are in an erased state and by applying at least one additional erase pulse to each cell.

19. The system of claim 18, wherein said control circuit applies said at least one additional erase pulse by determining a number of additional erase pulses to apply based on a number of first erase pulses applied and by applying said determined number of additional erase pulses to each cell.

20. The system of claim 18, wherein said control circuit applies said at least one additional erase pulse by determining a number of additional erase pulses to apply and by applying said determined number of additional erase pulses to each cell.

21. The system of claim 17, wherein said control circuit erases said cells by offsetting an erase verify bias used to determine if said flash memory cells are in an erased state, applying at least one erase pulse to each flash memory cell, determining whether contents of said cells are erased using said offset erase verify bias.

22. The system of claim 21, wherein said control circuit offsets said erase verify bias by increasing a reference current used to differentiate between the erased state and a non-erased state.

23. The system of claim 21, wherein said control circuit offsets said erase verify bias by changing a gate bias applied to said cells.

24. The system of claim 21, wherein said control circuit offsets said erase verify bias by increasing a reference current used to differentiate between the erased state and a non-erased state and changing a gate bias applied to said cells.

25. The system of claim 17, wherein said control circuit performs said healing operation by injecting electrons into said cells by Fowler-Nordheim electron injection.

26. The system of claim 17, wherein each cell is connected to receive a plurality of voltages and said control circuit performs said healing operation by injecting electrons into said cells by Fowler-Nordheim electron injection caused by altering said voltages.

27. The system of claim 26, wherein said voltages comprise a gate voltage, drain voltage, source voltage and a substrate voltage.

28. The system of claim 17, wherein said control circuit performs said healing operation by injecting electrons into said cells by hot-electron injection.

29. The system of claim 17, wherein said over-erased state is a state where said cells are more conductive than an erased state.

* * * * *